US009360530B2

(12) United States Patent
Kessler et al.

(10) Patent No.: US 9,360,530 B2
(45) Date of Patent: Jun. 7, 2016

(54) METHOD AND SYSTEM FOR ENERGY STORAGE CAPACITY ESTIMATION OF BATTERY CELLS

(71) Applicant: Google Technology Holdings LLC, Mountain View, CA (US)

(72) Inventors: Kenneth L. Kessler, Lake Zurich, IL (US); Richard Jakubowski, Buffalo Grove, IL (US); Robert M. Johnson, Lake Zurich, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 130 days.

(21) Appl. No.: 14/072,824

(22) Filed: Nov. 6, 2013

(65) Prior Publication Data

US 2015/0048801 A1 Feb. 19, 2015

Related U.S. Application Data

(60) Provisional application No. 61/867,201, filed on Aug. 19, 2013.

(51) Int. Cl.
*H02J 7/04* (2006.01)
*G01R 31/36* (2006.01)
(Continued)

(52) U.S. Cl.
CPC .......... *G01R 31/3624* (2013.01); *G06F 1/3212* (2013.01); *H02J 7/009* (2013.01); *H02J 7/0047* (2013.01); *H02J 2007/005* (2013.01); *Y02B 60/1292* (2013.01)

(58) Field of Classification Search
CPC . H02J 7/0091; H02J 2007/005; H02J 7/0047; G06F 1/3212; Y02B 60/1292; G01R 31/3624
USPC ......... 320/106, 107, 112, 116, 132, 134, 136, 320/149
See application file for complete search history.

(56) References Cited

U.S. PATENT DOCUMENTS

| 5,119,011 A | * | 6/1992 | Lambert | ............. B60L 11/1862 318/139 |
| 5,573,869 A | * | 11/1996 | Hwang | ............... H01M 2/1066 429/100 |
| 5,684,387 A | * | 11/1997 | Patino | ................... H01M 10/46 320/106 |

(Continued)

FOREIGN PATENT DOCUMENTS

WO 2011008600 A1 1/2011

OTHER PUBLICATIONS

"ModelGauge m3 Fuel Gauge," Maxim Integrated, max17047/max17050, 19-6008; Rev 3; 8/12, all pages.

*Primary Examiner* — Helen Rossoshek
(74) *Attorney, Agent, or Firm* — McDonnell Boehnen Hulbert & Berghoff LLP (57) ABSTRACT

An apparatus (100) includes at least one electrochemical cell (106) and at least one pass element (104) serially coupled with the electrochemical cell. A control circuit (102) is operable to open the at least one pass element when a charger (105) or power supply (107) is connected to the electrochemical cell for at least a predetermined time and to measure an open circuit voltage of the at electrochemical cell to determine a state of charge. The control circuit can then close the pass element to charge the electrochemical cell, determine an amount of the charge, and store an estimated energy capacity of the electrochemical cell based upon the open circuit voltage and the amount.

13 Claims, 8 Drawing Sheets

(51) Int. Cl.
   *H02J 7/00*     (2006.01)
   *G06F 1/32*     (2006.01)

(56) References Cited

U.S. PATENT DOCUMENTS

| | | | | |
|---|---|---|---|---|
| 5,710,506 | A * | 1/1998 | Broell | H02J 7/0073 320/145 |
| 5,804,944 | A * | 9/1998 | Alberkrack | H02J 7/0011 320/163 |
| 5,825,155 | A * | 10/1998 | Ito | G01R 19/16542 320/118 |
| 5,900,718 | A * | 5/1999 | Tsenter | H02J 7/0077 320/151 |
| 6,313,605 | B1 * | 11/2001 | Tsenter | H02J 7/0073 320/125 |
| 6,448,743 | B2 * | 9/2002 | Sano | G01R 31/362 320/162 |
| 6,586,130 | B1 | 7/2003 | Guiheen et al. | |
| 6,842,708 | B2 * | 1/2005 | Odaohhara | G06F 1/28 702/57 |
| 7,336,054 | B2 * | 2/2008 | Crisp | H02J 7/0006 320/106 |
| 7,382,110 | B2 * | 6/2008 | Hogari | G01R 31/361 320/132 |
| 7,564,217 | B2 * | 7/2009 | Tanigaw | H02J 7/0026 320/118 |
| 7,573,237 | B2 * | 8/2009 | Cutrona | G01R 31/362 320/114 |
| 7,576,545 | B2 * | 8/2009 | Singh | G01R 31/3634 320/132 |
| 7,598,709 | B2 * | 10/2009 | Guang | H02J 7/0077 320/135 |
| 7,710,074 | B2 * | 5/2010 | Kim | H02J 7/0047 320/132 |
| 7,969,119 | B2 * | 6/2011 | Odaohhara | H02J 7/045 320/134 |
| 8,103,401 | B2 * | 1/2012 | Kubo | B60L 11/1855 320/116 |
| 8,384,390 | B2 * | 2/2013 | Zhang | G01R 31/3658 320/118 |
| 8,855,956 | B2 * | 10/2014 | Thomas-Alyea | G01R 31/362 702/57 |
| 2004/0128086 | A1 | 7/2004 | Barsoukov et al. | |
| 2009/0115420 | A1 * | 5/2009 | Koch | G01R 31/3648 324/432 |
| 2009/0153100 | A1 * | 6/2009 | Okumura | H02J 7/0026 320/116 |
| 2009/0171598 | A1 * | 7/2009 | Nakashima | G01R 19/16542 702/63 |
| 2011/0156654 | A1 * | 6/2011 | Kim | H02J 7/0004 320/134 |
| 2012/0293131 | A1 | 11/2012 | Nakamura et al. | |
| 2014/0068310 | A1 * | 3/2014 | Sultenfuss | G06F 1/28 713/340 |
| 2014/0084856 | A1 * | 3/2014 | Howard | H02J 7/007 320/108 |
| 2014/0167685 | A1 * | 6/2014 | Tang | H02J 7/0014 320/107 |
| 2014/0177115 | A1 * | 6/2014 | Gojenola | H01M 2/1055 361/87 |
| 2015/0061595 | A1 * | 3/2015 | Kim | H02J 7/0026 320/112 |
| 2015/0086896 | A1 * | 3/2015 | Chang | H01M 8/0482 429/451 |
| 2015/0160300 | A1 * | 6/2015 | Ishii | G01R 31/3648 702/63 |
| 2015/0369869 | A1 * | 12/2015 | Tsuzuku | G01R 31/3606 324/427 |

* cited by examiner

னU.S. Patent No. US 9,360,530 B2

METHOD AND SYSTEM FOR ENERGY STORAGE CAPACITY ESTIMATION OF BATTERY CELLS

BACKGROUND

1. Technical Field

This disclosure relates generally to systems, and more particularly to battery systems.

2. Background Art

Portable electronic devices, such as cellular telephones, laptop computers, tablet computers, pagers, and two-way radios for example, derive their portability from batteries having rechargeable cells. These batteries allow these devices to slip the surly bonds of wired power connections to travel with users wherever they may go. A typical battery disposed within one of these devices includes one or more electrochemical cells that may be charged and discharged hundreds of times over the lifetime of the battery. This is particularly true due to the daily reliance people increasingly place upon their personal devices.

When a rechargeable battery is new, the cells within that battery can typically be charged to their maximum rated capacity. Said differently, one hundred percent of the cell capacity is available to store and deliver energy when the battery is new. As the battery is charged and discharged over the course of its life, however, the energy storage capacity of its cell(s), which measures the battery's capability to power a device, decreases due to chemical changes occurring within the cell(s). For example, after roughly 400 charge/discharge cycles, the cell(s) within a battery may only be chargeable to eighty-five or less percent of their original maximum capacity. As a result, a user may notice that the portable electronic device that receives its power from the cell(s) does not provide as much "run time" for active operations or as much "idle time" for standby operations between charging cycles as the device initially did. To understand how the cell(s) are presently performing, it would be advantageous to be able to quickly estimate the remaining capacity of the cell(s) disposed within a rechargeable battery.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Before describing in detail embodiments that are in accordance with the present disclosure, it should be observed that the embodiments reside primarily in combinations of method steps and apparatus components related to estimating charge capacity of one or more cells disposed in a rechargeable battery configured in accordance with one or more embodiments of the disclosure. Any process descriptions or blocks in flow charts should be understood as representing modules, segments, or portions of code that include one or more executable instructions for implementing specific logical functions or steps in the process. Alternate implementations are included, and it will be clear that functions may be executed out of order from that shown or discussed, including substantially concurrently or in reverse order, depending on the functionality involved. Accordingly, the apparatus components and method steps have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

It will be appreciated that embodiments of the disclosure described herein may be comprised of one or more conventional processors and unique stored program instructions that control the one or more processors to implement, in conjunction with certain non-processor circuits, some, most, or all of the functions of estimating cell energy storage capacity as described herein. The non-processor circuits may include, but are not limited to, a radio receiver, a radio transmitter, signal drivers, clock circuits, power source circuits, and user input devices. As such, these functions may be interpreted as steps of a method to perform charge and discharge capacity information. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used. Thus, methods and means for these functions have been described herein. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. Also, reference designators shown herein in parenthesis indicate components shown in a figure other than the one in discussion. For example, talking about a device (10) while discussing figure A would refer to an element, 10, shown in figure other than figure A.

The demand for energy from a battery pack is constantly increasing due to the advent of new portable devices, e.g., smart phones, tablet computers, and laptop computers. The increased demand for energy is due, in part, to the new feature sets included in these devices. For example, while mobile phones used to be used only for making telephone calls, today users employ smart phones to make telephone calls, surf the web, watch videos, play games, and take pictures. Additionally, many smart phones today run software operating systems that are similar to those used by personal computers, with various operating systems, features, and applications operating in the background even when the device appears to be OFF. Moreover, many of these devices include touch sensitive screens and wireless connectivity, each of which presents an increased demand for energy.

It is known that in rechargeable batteries, such as lithium-ion or lithium-ion polymer batteries, the number of charging and discharging cycles that a cell experiences has a dramatic impact on the energy storage capacity of the internal cell(s). The decrease in energy storage capacity can be due to a variety of factors. For example, charging at high current can cause abnormalities within the cell(s), e.g., lithium plating, which may cause non-uniform current handling distribution on the anode of the cell(s). The plating thus results in a reduction of cell energy density and thermal stability degradation. Internal heating during charge and discharge can also result in decreased cell capacity and shorter battery cycle life. As noted above, a single cell can lose fifteen to twenty percent of its capacity after a few hundred charge and discharge cycles.

It can be important to understand how much the energy storage capacity has degraded in the field. For example, the inventors of embodiments of the present disclosure have discovered that it can be particularly important to know the remaining capacity in an electronic device repair and/or refurbishment application. When a person takes an electronic device, such as a smartphone or tablet, a repair technician needs a convenient and quick way to determine remaining energy storage capacity of the cell(s) disposed within the battery. If there is insufficient energy storage capacity remaining, the battery needs to be replaced. However, if there is sufficient energy storage capacity, no replacement is required.

Some prior art batteries include capacity measurement circuits. Illustrating by example, prior art "Coulomb counters" measure the amount of current going into or out of one or more cell(s) across time. These circuits then take periodic voltage measurements of the cell(s), and combine those measurements with current count to estimate energy capacity, which is stored in a memory of the battery. However, the prior art capacity measurement circuits are generally less than useful to the technician mentioned above. This is true for two reasons: First, when capacity estimates are actually made, the circuits are configured to take necessary measurements at cell usage points that are infrequently reached by users. Second, and more importantly, many manufacturers disable or modify the measurement apparatus because these circuits require an open circuit cell voltage measurement. Accordingly, when the circuits make voltage measurements, the cell(s) are momentarily disconnected from the device, which can terminate background operations running in the device. As this is frustrating to the user, some manufacturers require the measurement to be done very infrequently, if at all.

Illustrating by example, one prior art Coulomb counter will open the circuit to the cell(s) within the battery to measure cell voltage when the cell(s) are approximately ninety-five percent fully charged. It will then open the cell circuit to measure the voltage when the cell(s) are approximately five percent charged. It then counts the amount of current charged into, or discharged from, these two points and estimates capacity in milliamp-hours (mAh). The inventors of the present disclosure have determined from experimental testing that a large number of users do not discharge the cell(s) in their devices to the five percent level prior to recharging. Most devices provide alarms to the user at the ten or twenty percent energy storage levels, which causes users to begin charging at these levels at a minimum. Consequently, even when the prior art Coulomb counter is operational, it may seldom make capacity estimates due to the fact that the five percent discharge level is never reached. Accordingly, when the technician tries to determine capacity by reading the memory of the device or battery, frequently the information is not there. Similarly, when a device manufacturer disables or delays the capacity estimate to prevent the measurement from killing all background operations running in the device, capacity information is either not present in the memory of the device or battery, or is so old that it is no longer accurate.

When either condition occurs, the only way for the technician to determine the capacity estimate is to fully discharge the cells of the battery, and then to recharge them again. This process can take as long as a day and requires extensive labor costs. It is thus completely cost-prohibitive in a repair/reconditioning environment. Experimental testing by the inventors in the repair/reconditioning environment has shown that many devices employing prior art Coulomb counters are brought to repair/refurbish stations without any—or at least without any recent—capacity estimates stored in memory. Fully discharging and re-charging the cells in a battery to obtain an accurate estimate for repair purposes takes a tremendous amount of time, energy, and labor, and is thus cost-prohibitive.

Embodiments of the present disclosure provide a solution to this previously undiscovered problem. In one embodiment, methods and systems described below apply a forced capacity estimate that occurs at a predetermined frequency, such as once a week. In one embodiment, the estimate only occurs when the device is connected to a charger or power supply. When necessary measurements are being made, the connected device continues to be powered by the charger or power supply to prevent termination of background operations running on the device.

In one embodiment, rather than using the prior art five and ninety-five percent thresholds described above, systems and methods described below are configured to accurately estimate capacity using measurement points that a user will actually meet during ordinary operation. For instance, in one embodiment a first measurement is taken when the cell(s) are between about twenty percent charged and about sixty percent charged. Experimental testing has shown that the vast majority of cell(s) in batteries in portable electronic devices fall within this range during normal use. The second measurement is taken when the charging current begins to taper. Using these thresholds to begin the measurement, combined with ensuring that a charger or power supply is connected prior to making the measurement, ensures that the effectiveness of making and recording a capacity estimate is very good.

At the same time, methods and systems described below are capable of making more accurate capacity estimates than are prior art systems. This accuracy can be attributed to two factors. First, by starting within the predetermined capacity range, systems and methods described below ensure that a sufficient amount of data is acquired to render the measurement sufficiently accurate. Second, and more importantly, in one or more embodiments an open circuit voltage measurement of the cell(s) disposed within the battery are taken prior to charging the cell(s) and after the cell(s) have been disconnected from corresponding circuitry for at least a predetermined cell relaxation period. Experimental testing has shown that once cell(s) start charging and are opened from the charging circuit, a significant amount of time is required for the electrochemistry of the cell to sufficiently relax for accurate voltage measurements. Embodiments of the disclosure contemplate that when voltage readings are made prior to charging, the predetermined relaxation period is far shorter. Accordingly, in one or more embodiments open circuit voltage measurements are taken prior to charging, but after a predetermined relaxation period has expired. This results in a more accurate capacity estimate in a shorter period of time compared with prior art capacity estimation systems and methods.

Before turning to the figures, it should be noted that for ease of discussion, embodiments of the disclosure will be described in a single-cell system. Single cell systems are useful for illustration purposes because many devices, such as smart phones, use a rechargeable battery with a single lithium-based cell. However, it will be obvious to those of ordinary skill in the art having the benefit of this disclosure that embodiments are not so limited. The systems and methods described below are readily applicable to multi-cell systems as well. Thus, while a single-cell system will be used for illustration, the disclosure is not meant to be limiting in this regard.

Figure 1:
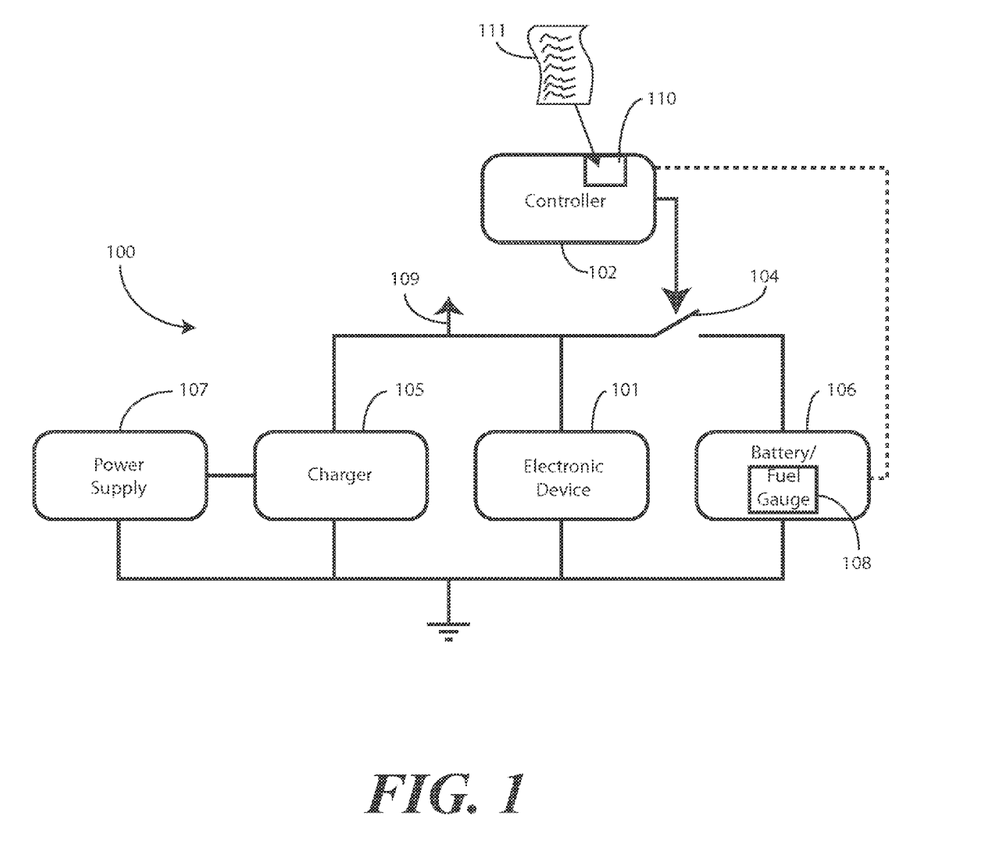
FIG. 1 illustrates one embodiment of a system to estimate cell capacity configured in accordance with one or more embodiments of the disclosure.

Turning now to FIG. 1, illustrated therein is one explanatory apparatus 100 configured in accordance with one or more embodiments of the disclosure. As shown in the figure, the apparatus 100 includes a control circuit 102 in communication with at least one pass element 104. The at least one pass element, which may be a transistor, such as a bipolar junction transistor or metal oxide silicon field effect transistor, is serially coupled with at least one electrochemical cell 106. In this illustrative embodiment, the electrochemical cell 106 is a single lithium-ion cell. Standard single-cell lithium-ion batteries typically operate between a rated charge voltage of 4.35 volts (which is solely one example, with 4.2 volts being another example) and a rated discharge voltage of 3.0 volts. This means that charging current is limited or stopped when the cell voltage rises to 4.35 volts, and correspondingly that discharging current is limited or stopped when the cell voltage falls to 3.0 volts. Further, such cells are typically rated to charge or discharge at a "1-C" rate. This means that charging or discharging current is frequently limited to a predetermined level. In a 400 mA-h cell, a "1-C" rate means that charging or discharging current is typically limited to 400 mA.

The electrochemical cell 106 is coupled to, and is operable to power, an electronic device 101. The electronic device 101 can be separated from the apparatus 100, along with the electrochemical cell 106, to become portable. However, in FIG. 1, the electronic device 101 has been coupled to a charger 105 and corresponding power supply 107 so that the electrochemical cell 106 can be charged.

The electrochemical cell 106 is operable with a fuel gauge 108 in this illustrative embodiment. The fuel gauge 108 is capable of determining an amount of charge current entering, or discharge current leaving, the electrochemical cell 106. The control circuit 102, working in tandem with the fuel gauge 108 and the at least one pass element 104, is capable of determining an estimated energy capacity of the electrochemical cell 106. In one embodiment, the control circuit 102 is configured to measure an open circuit voltage of the electrochemical cell 106 at one or more points. The control circuit 102 can then use the open circuit voltage(s), combined with the amount of current entering or leaving the electrochemical cell 106 between these voltage(s), to determine the estimated energy capacity. The details of how this occurs will become clearer with reference to the methods shown in FIGS. 5 and 6 below.

In one embodiment, the control circuit 102 is operable to open the at least one pass element 104 to make open circuit voltage measurements of the electrochemical cell 106 when the electronic device 101 is connected to the charger 105 and/or power supply 107. In one embodiment, the control circuit 102 is operable to open the at least one pass element 104 to make the open circuit voltage measurements only when the electronic device 101 is connected to the charger 105 and/or power supply 107. Operating in this manner allows the charger 105 and/or power supply 107 to continue to power the device 101 while the electrochemical cell 106 is disconnected from the device 101 by the at least one pass element 104. Advantageously, this permits background operations, applications, and features running on the device 101 to keep running despite the fact that the at least one pass element 104 is open.

In one embodiment, the control circuit 102 is to open the at least one pass element 104 before any charging of the electrochemical cell 106 occurs. In one embodiment, to provide sufficient time for the electrochemistry of the electrochemical cell 106 to relax enough to provide the desired accuracy of measurement, the control circuit 102 is to open the at least one pass element 104 for at least a predetermined time prior to charging. Experimental testing has shown that a predetermined time of at least one minute works well in many applications. In one explanatory embodiment described below, the predetermined time is about four minutes, which yields an accuracy of estimated energy capacity of plus or minus five percent when methods begin with the cell between about twenty percent charged and about sixty percent charged.

Once the at least one pass element 104 is open, in one embodiment the control circuit 102 is to measure an open circuit voltage of the electrochemical cell 106. In one embodiment, the control circuit 102 is to measure the open circuit voltage of the electrochemical cell 106 only after the predetermined time has passed since the at least one pass element 104 was opened.

Once the open circuit voltage has been measured, in one embodiment, the control circuit 102 is to close the at least one pass element 104 to allow the charger 105 and/or power supply 107 to charge the electrochemical cell 106. While charging, the fuel gauge 108 can determine the amount of current being delivered to the electrochemical cell 106 from the charger 105 and/or power supply 107. From this information, the control circuit 102 can determine the amount of charge delivered to the electrochemical cell 106.

As noted above, where the electrochemical cell 106 is a single lithium-ion cell, it will reach a termination voltage such as 4.35 volts. When this occurs, the charging adjusts from a constant current mode, e.g., charging at a 1-C rate, to a constant voltage mode where the supply voltage 109 is held constant at the termination voltage. The control circuit 102 is to detect this as a sufficiently full charge point, and optionally has the termination voltage stored in memory 110.

The control circuit 102 can determine the estimated energy capacity from the initial open circuit voltage measurement and the amount of charge. Illustrating by example, in one embodiment, the control circuit 102 can reference a look-up table 111 stored in memory 110 for the electrochemical cell 106 that references state of charge with voltage. Using the open circuit voltage measured after the predetermined relaxation time, the control circuit 102 can determine the initial state of charge prior to charging. The control circuit can then determine the estimated energy storage capacity with the following equation:

$$\text{Est. Eng. Storage Cap.} = 100 * \text{Amt. of Charge} / (100 - \text{Initial State of Charge}) \quad \text{EQ. 1}$$

Once determined, the estimated energy storage capacity can be stored in memory 110. If the device is delivered to a repair/refurbish shop, the repair technician can quickly and easily read the estimated energy storage capacity to determine whether to replace the electrochemical cell 106.

In one embodiment, the control circuit 102 is to make the estimated energy storage capacity determination at least at a predefined maximum frequency. For example, in one embodiment, the control circuit 102 is to ensure that the estimated energy storage capacity is determined no more than once a week. As will be understood by those of ordinary skill in the art having the benefit of this disclosure, when the at least one pass element 104 is open for the predetermined relaxation time, no charging of the electrochemical cell 106 occurs. This results in the overall charging cycle becoming longer whenever the estimated energy storage capacity determination is made. To avoid aggravating users, in one or more embodiments the control circuit 102 is to ensure that at least a predetermined measurement period has passed prior to making the estimated energy storage determination to ensure that the predefined maximum frequency is not exceeded.

As previously mentioned, the apparatus of FIG. 1 is designed to allow the charger 105 and/or power supply 107 to power the device 101 while the electrochemical cell 106 is isolated from the device 101. It should be noted that the power and/or charging provided by the charger 105 and/or power supply can be delivered through either wired or wireless connections. This configuration allows the device 101 to continue to be powered despite the at least one pass element 104 being open sufficiently long to allow sufficiently accurate open circuit voltage measurements of the electrochemical cell. Using the look-up table 111, the control circuit 102 can determine an accurate initial state of charge. It should be noted that in one embodiment, the open circuit voltage of the electrochemical cell is only taken once, i.e., at the starting point of charging, with the estimated energy storage capacity being based on a charging profile transitioning from constant current to constant voltage. This method eliminates the necessity of again opening the at least one pass element 104 to make a second measurement, thereby reducing the amount of time required to make the estimated energy storage capacity determination.

Figure 2:
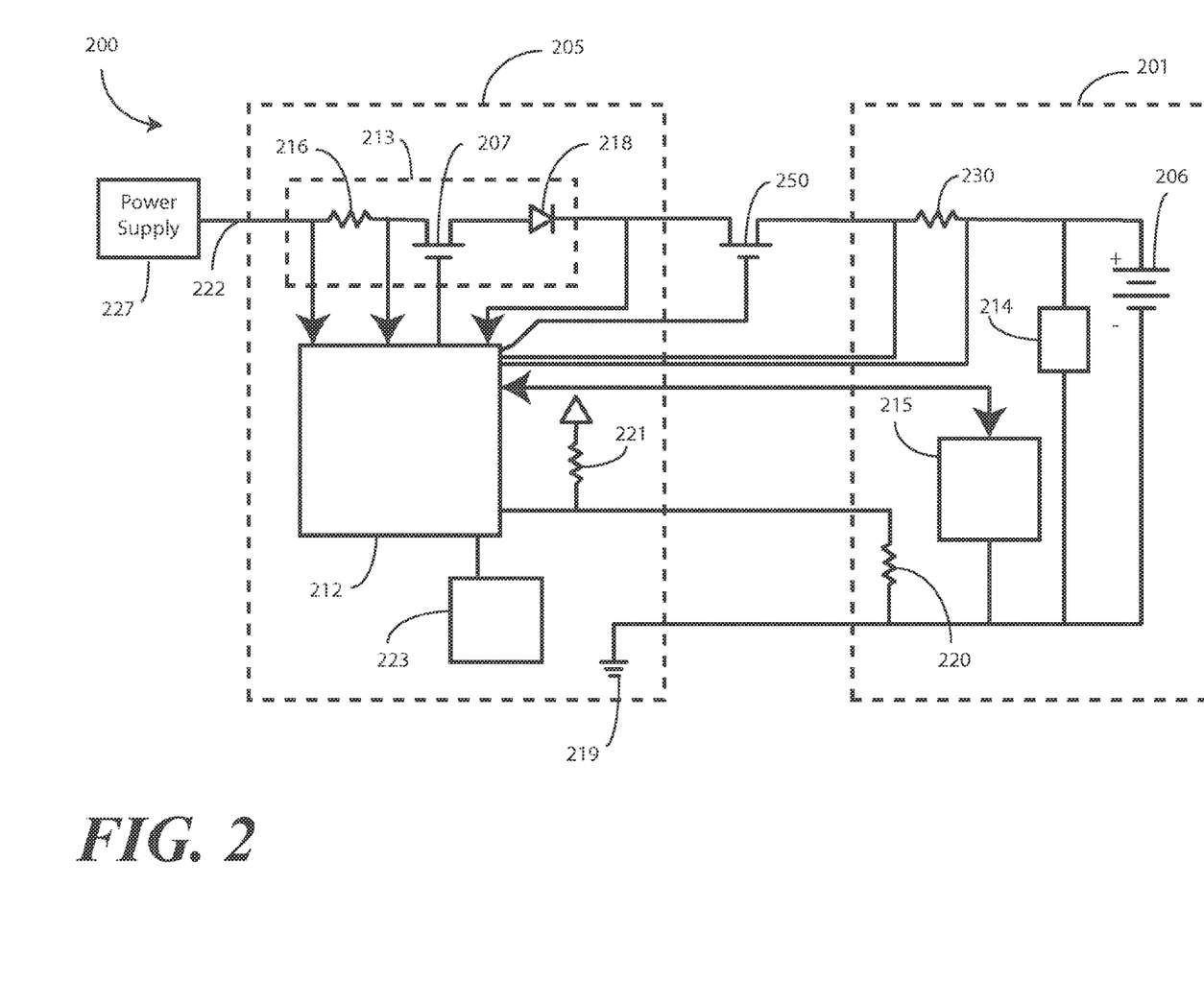
FIG. 2 illustrates one explanatory cell capacity estimation system configured in accordance with one or more embodiments of the disclosure.

Turning now to FIG. 2, illustrated therein is an alternate apparatus 200 for estimating cell capacity configured in accordance with one or more embodiments of the disclosure. In the explanatory apparatus 200 of FIG. 2, a charging circuit 205 is shown coupled to a battery 201 and a power supply 227. The power supply 227 can provide charging current to the charging circuit 205, which can feed the charging current to the battery 201 to charge the electrochemical cell 206 in accordance with one or more methods described herein. The charging circuit 205 can include a control circuit 212 configured to control the amount of charging current that flows to the battery 201.

The charging circuit 205 can be any device capable of directing and controlling charging current that flows to the battery 201. In one or more embodiments, the charging circuit 205 and the battery 201 can be integrated into a single electronic device. For example, in some embodiments, both the charging circuit 205 and the battery 201 will be integrated into an electronic device such that the user need only connect the electronic device to the power supply 227 to charge the electrochemical cell 206. As an example, the charging circuit 205 can be a mobile communications device—such as a cellular telephone, tablet computer, two-way radio, or a personal digital assistant—or a desktop charger that can provide power to a battery for a mobile communications device. Of course, embodiments of the disclosure are not limited to these particular examples, as other suitable devices can serve as the charging circuit 205 as well.

In one or more embodiments, the battery 201 can optionally include its own independent energy management circuit 214. Where such an energy management circuit 214 is included, many of the functions of the control circuit 212 of the charging circuit 205 can be embedded completely within the battery 201. The inclusion of the energy management circuit 214 allows methods of the disclosure to be executed completely within the battery 201, as opposed to relying upon an ancillary circuit such as charging circuit 205.

As shown in FIG. 2, the charging circuit 205 can optionally include, for example, a current control circuit 213 that functions as a regulator and is operable with the control circuit 212. The battery 201, or optionally the charging circuit 205, can include, for example, a memory 215. Information can be written to the memory 215, including energy storage capacity estimates for the electrochemical cell 206. Where the control circuit 212 estimates the cell capacity from information such as the state of charge and an amount of charge delivered to the electrochemical cell 206 since the after the state of charge is determined, the estimated cell capacity can be written to the memory 215. In one arrangement, the memory 215 of the battery 201 can be an electrically erasable programmable read only memory, although other suitable types of memory devices can also be used with the battery 201.

The current control circuit 213 of the charging circuit 205 can include, for example, a sense resistor 216, a field effect transistor 217, and an optional diode 218. The control circuit 212 can use, as inputs, connections disposed on either side of the sense resistor 216 to determine when the charging current is reduced below a predetermined threshold indicative of charge completion, such as 100 mA in one embodiment.

The control circuit 212 can also control the operation of the field effect transistor 217 as well. The output of the current control circuit 213 can lead to a B+ contact, which can be coupled to the electrochemical cell 206 of the battery 201. An input from the B+ contact can also be coupled to the control circuit 212. The negative side of the electrochemical cell 206 can be coupled to a B- contact, which can be coupled to a ground terminal 219 in the charging circuit 205. In addition, data can be transferred between the control circuit 212 and the memory 215 through a data contact. Examples of the type of data that can be exchanged between the control circuit 212 and the memory 215 include the estimated cell capacity, look-up tables referencing open circuit voltages of the electrochemical cell 206 to state of charge values, charge delivered to and from the electrochemical cell 206 in milliamp-hours, monitored values recorded across a predetermined charge or discharge time, profiles of usage, predefined criteria corresponding to the electrochemical cell 206, characteristic cell voltages corresponding to capacity, and other information.

In one or more embodiments, the battery 201 can also include an optional thermistor 220. As is known in the art, the control circuit 212 can monitor cell temperature from the thermistor 220 through a thermistor contact. The charging circuit 205 can further include a pull-up resistor 221 to a power supply to enable the control circuit 212 to measure the temperature readings generated by the thermistor 220. Although not shown, the control circuit 212 can include analog-to-digital (A/D) converters and input/outputs (I/O), which, as those of ordinary skill in the art will appreciate, can enable the control circuit 212 to receive and process the information being generated from the components described above.

In operation, when the power supply 227 is coupled to the charging circuit 205, charging current can flow from the power supply 227 to the battery 201 through the charging circuit 205 to charge the electrochemical cell 206. The control circuit 212 can monitor the charging current that is being transferred to the battery 201 from the current sense resistor 230. The control circuit 212 can monitor the voltage on the battery 201 through the input from the B+ contact. During the charging process, the control circuit 212 can also monitor the temperature of the battery 201 from the thermistor 220. If the temperature rises above a predetermined threshold, the control circuit 212 can adjust the flow of charging current accordingly.

In one or more embodiments, the control circuit 212 is configured to estimate cell energy storage capacity in accordance with one or more methods described herein. For example, in one embodiment the control circuit 212 can open field effect transistor 250 in response to detecting the power supply 227, which functions a charger in this embodiment, being coupled to a charging terminal 222. In one embodiment, the control circuit 212 opens field effect transistor 250 prior to the power supply 227 providing any charging current to the electrochemical cell 206 to charge the electrochemical cell 206. As noted above, experimental testing has shown, advantageously, that opening the circuit coupled serially between one or more cells of a battery and a charging terminal prior to the charger charging the one or more cells reduces the relaxation time required to yield sufficiently accurate open circuit voltage measurements.

In one or more embodiments, the control circuit 212 may not open the field effect transistor 250 immediately upon detection of the power supply 227 being coupled. Instead, the control circuit 212 can delay the opening time for a predetermined duration, such as a few seconds to a minute, prior to opening the field effect transistor 250. Inclusion of such a delay advantageously prevents quick detection and removal sequences of the power supply 227 from causing unintended errors in cell energy storage capacity estimation sequence.

Once the control circuit 212 has opened the field effect transistor 250, in one embodiment the control circuit 212 can execute precautionary diagnostics to ensure that the field effect transistor 250 is in fact open. For example, the control circuit 212 can confirm the opening of the field effect transistor 250 in one embodiment by measuring either the instantaneous current passing through the current sense resistor 230 or the average current passing through the current sense resistor 230.

In running the diagnostics, the control circuit 212 may terminate the cell energy storage estimation if certain criteria are met. As an example, if the control circuit 212 detects instantaneous or average current passing through the current sense resistor 230 of the current control circuit 213, it may detect an issue with the field effect transistor 250 and may stop the estimation process.

Once the field effect transistor 250 has been opened, in one embodiment the control circuit will wait for a predetermined duration to sufficiently allow the electrochemistry of the electrochemical cell 206 to relax as to obtain an accurate open circuit voltage measurement. In one embodiment, the predetermined duration is at least two minutes. While waiting, it is understood that the electrochemical cell 206 is not charging. In one or more embodiments, the cell energy storage estimation occurs in the background and is not detectable to a user. Accordingly, the case can occur where a user connects the power supply 227 and expects to see an indication of charging presented on a user interface 223. To let the user know that the power supply 227 has been properly connected, but as not to frustrate the user that the electrochemical cell 206 is not charging, in one embodiment the control circuit 212 is to present an indication to the user on the user interface 223 that the overall charging process has occurred. However, so as not to be deceptive, in one embodiment this comprises presenting a charging process indicator on the user interface 223 that does not change state until the control circuit 212 closes the field effect transistor 250 to permit charging.

Where the predetermined duration is a prerequisite, after the predetermined duration has expired, the control circuit can measure an open circuit voltage of the electrochemical cell 206 to determine an initial state of charge of the electrochemical cell 206. As noted above, in one embodiment the state of charge is determined by referencing a look-up table in the memory 215. In one or more embodiments, the initial state of charge is required to be within certain state of charge limits Examples of such limits are about twenty percent charged and about sixty percent charged. Experimental testing has shown that such limits serve two purposes: First, they represent a range of states of charge that a user will typically enter during weekly use of their device. Second, they ensure that sufficient data in the energy storage capacity estimation calculation will be present as to ensure accuracy. For example, in many applications, if the initial state of charge is not within predetermined limits, the cell energy storage estimation may contain errors that cause the accuracy of the calculation to be not within acceptable limits. Accordingly, in one embodiment, the initial state of charge must be within a predefined range determined by an upper state of charge threshold and a lower state of charge threshold to begin the energy storage capacity measurement. Where the initial state of charge is less than the lower state of charge threshold, in one embodiment the control circuit 212 can wait for the state of charge to increase to the lower state of charge limit prior to opening the current control circuit. However, in other embodiments the control circuit 212 will simply terminate the calculation so as not cause the user to wait for the extended cell relaxation time prior to charging.

Once the initial state of charge is determined, the control circuit 212 can close the field effect transistor 250 to permit charging of the electrochemical cell 206. The control circuit 212 can determine an amount of charging occurring after the field effect transistor 250 is closed by measuring current through the current sense resistor 230 across time.

The control circuit 212 can then detect that charging is nearing completion. This can be done in any of a variety of ways. In one embodiment, this occurs when the control circuit 212 detects that the B+ voltage reaches the termination voltage of the electrochemical cell 206. In another embodiment, the control circuit 212 detects that the charging current, as sensed through the current sense resistor 230, falls below a predefined threshold, such as 100 mA. When charging is nearing completion, the control circuit 212 can estimate an energy storage capacity of the electrochemical cell 206 from the amount of charging and the initial state of charge using EQ. 1 above as previously described. In this illustrative method, note that the open circuit voltage of the electrochemical cell 206 was measured only once between the opening of the field effect transistor 250 and the estimation of the energy storage capacity.

Figure 3:
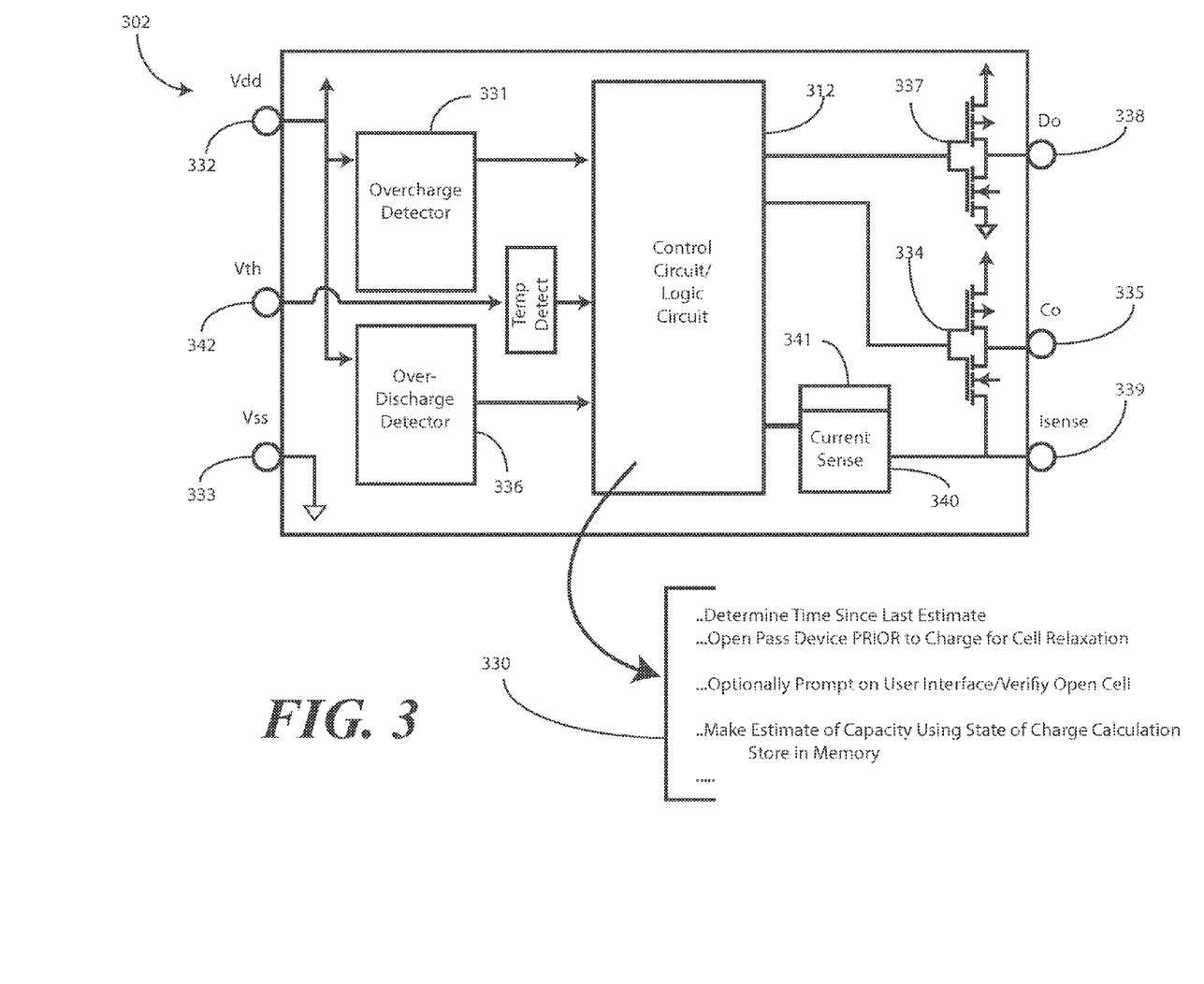
FIG. 3 illustrates one explanatory control circuit suitable for use in a battery and configured in accordance with one or more embodiments of the disclosure.
Figure 4:
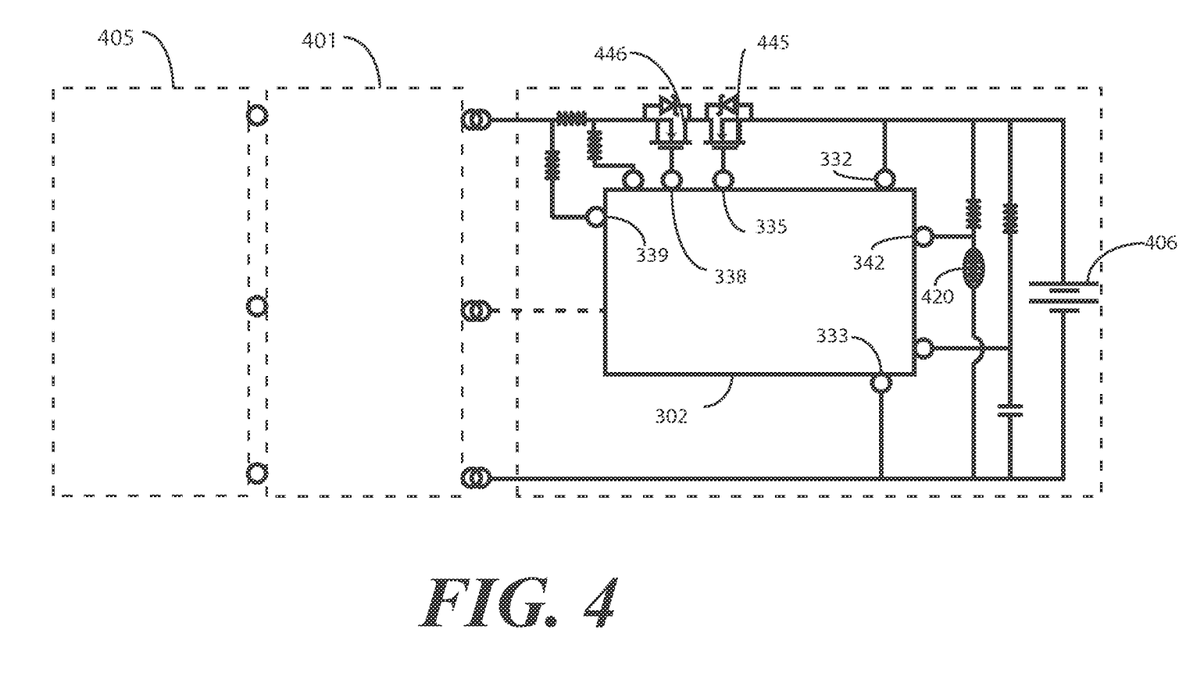
FIG. 4 illustrates one explanatory system for estimating cell capacity configured in accordance with one or more embodiments of the disclosure.

Turning now to FIGS. 3 and 4, illustrated therein is an alternate control circuit 302 suitable for inclusion in a battery configured in accordance with one or more embodiments of the disclosure. It should be noted that the control circuit 302 can be used with a given battery regardless of whether the battery is detachable from an electronic device or embedded therein.

The explanatory control circuit 302 of FIG. 3 is shown in schematic block diagram form along with logic instructions 330 that may be implemented by executable code residing in the control circuit 302 as described herein. Alternatively, the logic instructions 330 could be implemented in hardware circuits and components such as programmable digital logic, analog logic, digital logic, and so forth.

Prior to discussing the control circuit 302 and the logic instructions 330, some of the other features shown in the illustrative embodiment of FIG. 3 will be described. The illustrative embodiment of FIG. 3 shows the control circuit 302 configured both to estimate energy storage capacity of the rechargeable cells with which it is used, and also to serve as a "safety circuit." As used herein, a "safety circuit" is any circuit capable of monitoring the voltage across at least one rechargeable cell 406. As is known in the art, some rechargeable batteries, such as those employing lithium-ion and lithium-polymer cells, are generally coupled with protection components to ensure that they are not overcharged. Overcharging of such batteries can compromise reliability.

While the illustrative embodiment of FIG. 3 includes both safety features and energy management functions, it will be clear to those of ordinary skill in the art having the benefit of this disclosure that the disclosure is not so limited. The control circuit 302 can be implemented as a stand-alone device without safety functions. Further, while shown in FIG. 3 as an integrated circuit, embodiments of the present disclosure can be implemented as discrete circuits, application specific circuits, and as combinations of integrated circuits.

The illustrative control circuit 302 of FIG. 3 includes an overcharge detector 331. The overcharge detector 331 is configured to monitor a voltage across the rechargeable cell 406 to which it is coupled through a Vdd node 332 and a Vss node 333. The Vdd node 332 and a Vss node 333 monitor the voltage at the cathode and at the anode of the cell 406 coupled to the control circuit 302, respectively. As noted above, while embodiments of the disclosure will be described with the control circuit 302 being coupled to a single rechargeable cell, such as a single, lithium-ion or lithium-polymer cell, it will be obvious to those of ordinary skill in the art having the benefit of this disclosure that the disclosure is not so limited. The control circuit 302 could be used with multiple cells, coupled in series or parallel.

The overcharge detector 331 compares this sensed voltage to a predetermined maximum cell voltage threshold. When the cell voltage exceeds this threshold, the overcharge detector 331, which may work with the control logic 312, causes a push-pull output stage 334 to apply a control signal to the charge control node 335. When the charge control node 335 is coupled to a pass element 445, such as a metal oxide on silicon field effect transistor or bipolar junction transistor, the pass element 445 opens so as to prevent any further charging of the cell.

Similarly, the control circuit 302 can include an overdischarge detector 336 that ensures the voltage across the cell does not fall below a predetermined undervoltage threshold. If it does, the overdischarge detector 336 causes an output stage 337 to apply a control signal to a discharge control node 338. When the discharge control node 338 is coupled to a discharge disconnect switch 446 coupled in series with the cell 406, application of the control signal at the discharge control node 338 can open the discharge disconnect switch 446 or otherwise increase a serial impedance of a discharge current limiter, thereby reducing or preventing any further discharge of the cell.

In the illustrative embodiment of FIG. 3, current flowing through the cell or cells is monitored by way of a current sense node 339. The current sense node 339 is coupled to a current sensing circuit 340. In one embodiment, the current sensing circuit 340 may work with a delay circuit 341. The delay circuit 341, where used, can provide hysteresis and transient immunity for the current sense node 339.

In one mode, the current sense node 339, working with the current sensing circuit 340, senses the voltage between the Vdd node 332 and the current sense node 339. When this sensed voltage exceeds a predetermined threshold, the control logic 312 causes a control signal to be applied to the discharge control node 338. This control signal opens the discharge disconnect switch 446 or otherwise increases a serial impedance of a discharge current limiter, thereby stopping the flow of current in the discharge direction.

Other optional components of the control circuit 302 include a temperature-sensing node 342. The temperature-sensing node 342 may be coupled to a thermistor 420 or other temperature-sensing device to monitor the temperature of the rechargeable cell 406. This may be the case, for example, where an application requires that charging of the cell 406 only occur between the temperatures of 0 and 45 degrees centigrade.

In one embodiment of the disclosure, the control logic 312 is operable with the Vdd node 332 and a Vss node 333 to monitor the voltage at the cathode and at the anode of the cell 406 coupled to the control circuit 302, respectively. In doing so, the control logic 312 monitors the voltage of the attached cell 406 not only for safety purposes, but also to make open circuit voltage calculations. For example, in one embodiment the control logic 312 can cause the push-pull output stage 334 to apply a control signal to the charge control node 335, thereby opening a pass element 445 to preclude charging of the cell 406. In one embodiment, the control signal can be applied to the charge control node 335 for at least a predetermined relaxation period. In one embodiment, the predetermined cell relaxation period is sufficient for a cell capacity estimation to be accurate within a predetermined tolerance amount, such as plus or minus five percent. In one embodiment, the predetermined relaxation period is about four minutes.

After the predetermined relaxation period, the control logic 312 can measure the open circuit voltage of the cell 406 and can identify a state of charge of the cell 406 based upon the open circuit voltage measurement. The control logic 312 can then cause the push-pull output stage 334 to remove the control signal to the charge control node 335 to charge the cell 406. The control logic 312 can then receive an amount of charge current occurring after the closing of the pass element coupled to the charge control node 335 from the current sensing circuit 340 and can integrate that across time to obtain an amount of charge. The control logic 312 can then estimate the remaining cell capacity from the amount of charge and the initial state of charge as previously described. As set forth in EQ. 1 above, this can comprise dividing a function of the amount of charge by a function of the state of charge in one embodiment.

As shown in FIG. 4, the control circuit 302 and cell 406 can be coupled to an electronic device 401 and a charger 405. As noted above, in one or more embodiments, the electronic device 401 can be powered while the pass element 445 is open and the cell 406 is disconnected from the electronic device 401.

Figure 5:
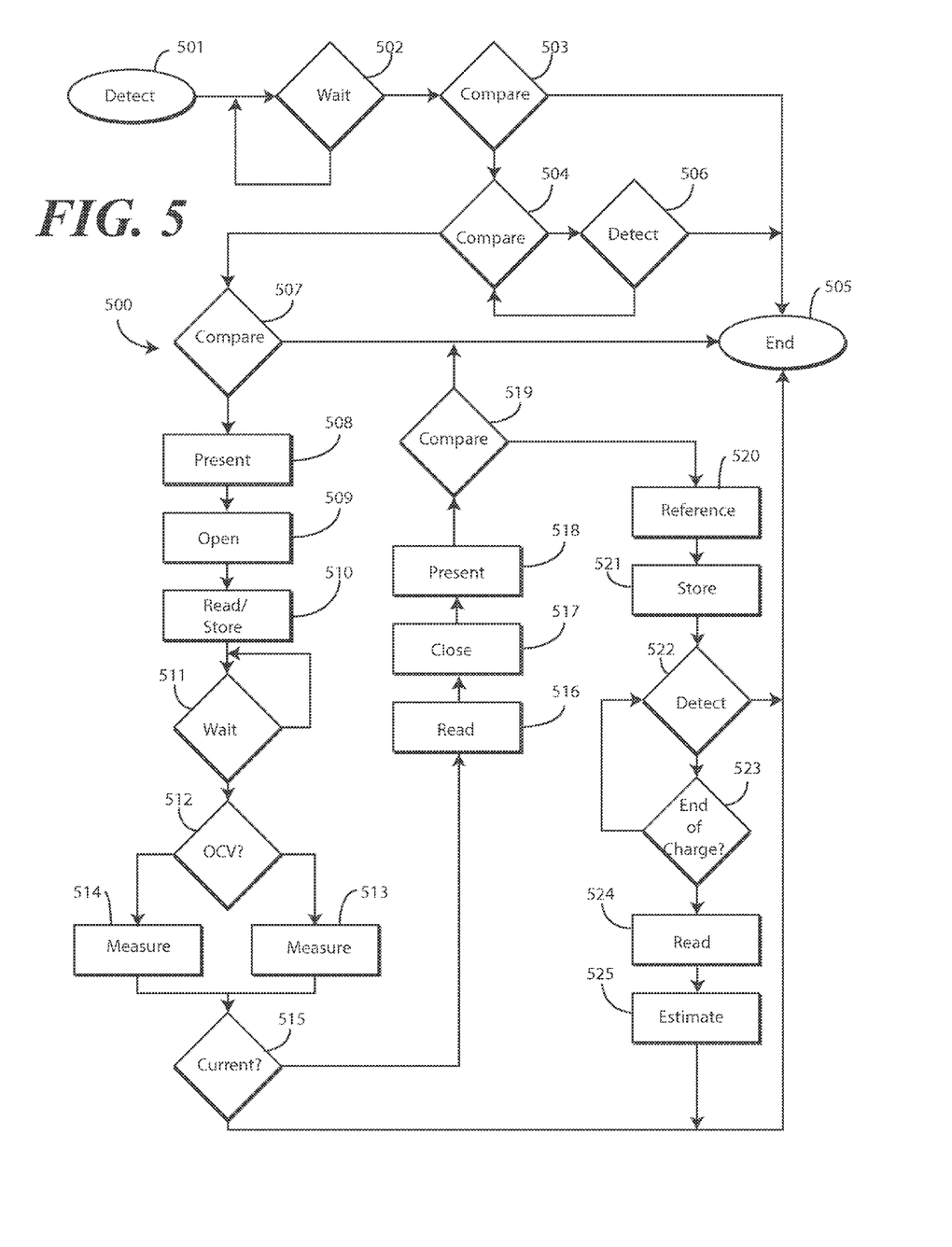
FIG. 5 illustrates one explanatory method for estimating cell capacity configured in accordance with one or more embodiments of the disclosure.

Turning now to FIG. 5, illustrated therein is one explanatory method 500 for estimating cell capacity in accordance with one or more embodiments of the disclosure. The method 500 can be implemented with any of the circuits of FIGS. 1-4.

At starting step 501, the method 500 detects that a charger and/or power supply is connected. When the charger and/or power supply is connected, optional decision 502 can be included to wait for a predetermined duration prior to executing the remainder of the method.

In one or more embodiments, the method 500 comprises detecting whether an initial state of charge of one or more cells of a battery coupled between a charger and/or power supply is within a predefined range prior to executing the remainder of the method 500. In the illustrative embodiment of FIG. 5, this occurs at decision 503 and decision 504. At decision 503, the state of charge of the cell is compared to an upper state of charge threshold. Where the state of charge is greater than the upper state of charge threshold, the method 500 can terminate at end step 505. At decision 504, the state of charge of the cell is compared to a lower state of charge threshold. Where the state of charge is less than the lower state of charge threshold, the method 500 can terminate at end step 505. In one embodiment, the predefined range is between about twenty percent charged and about sixty percent charged. Accordingly, the upper state of charge threshold occurring at decision 503 may be about sixty percent. Similarly, the lower state of charge threshold occurring at decision 504 may be about twenty percent. While these are examples shown to be beneficial as thresholds in practice, other thresholds will be obvious to those of ordinary skill in the art having the benefit of this disclosure.

In one embodiment, where the state of charge is less than the lower state of charge threshold, as determined at decision 504, the method 500 can allow the cell to charge to allow the state of charge to rise to the lower state of charge threshold. For example, optional decision 506 can detect whether the result of decision 504 was due to the charger being removed. If it is removed, the method 500 can terminate at end step 505. Where the charger remains connected, the state of charge of the cell is optionally again compared to the lower state of charge threshold at decision 504. Once the state of charge of the cell is above the lower state of charge threshold, the method 500 can proceed to decision 507.

At optional decision 507, the current can be compared to a charge threshold. Where the current is above or equal to the charge threshold, the method 500 can proceed to step 508. However, where the charge current is below the charge threshold, the method 500 can terminate at end step 505. It should be noted that this decision 507 is optional because in one or more embodiments, step 509 will occur prior to any charging current flowing to the cell.

Figure 7:
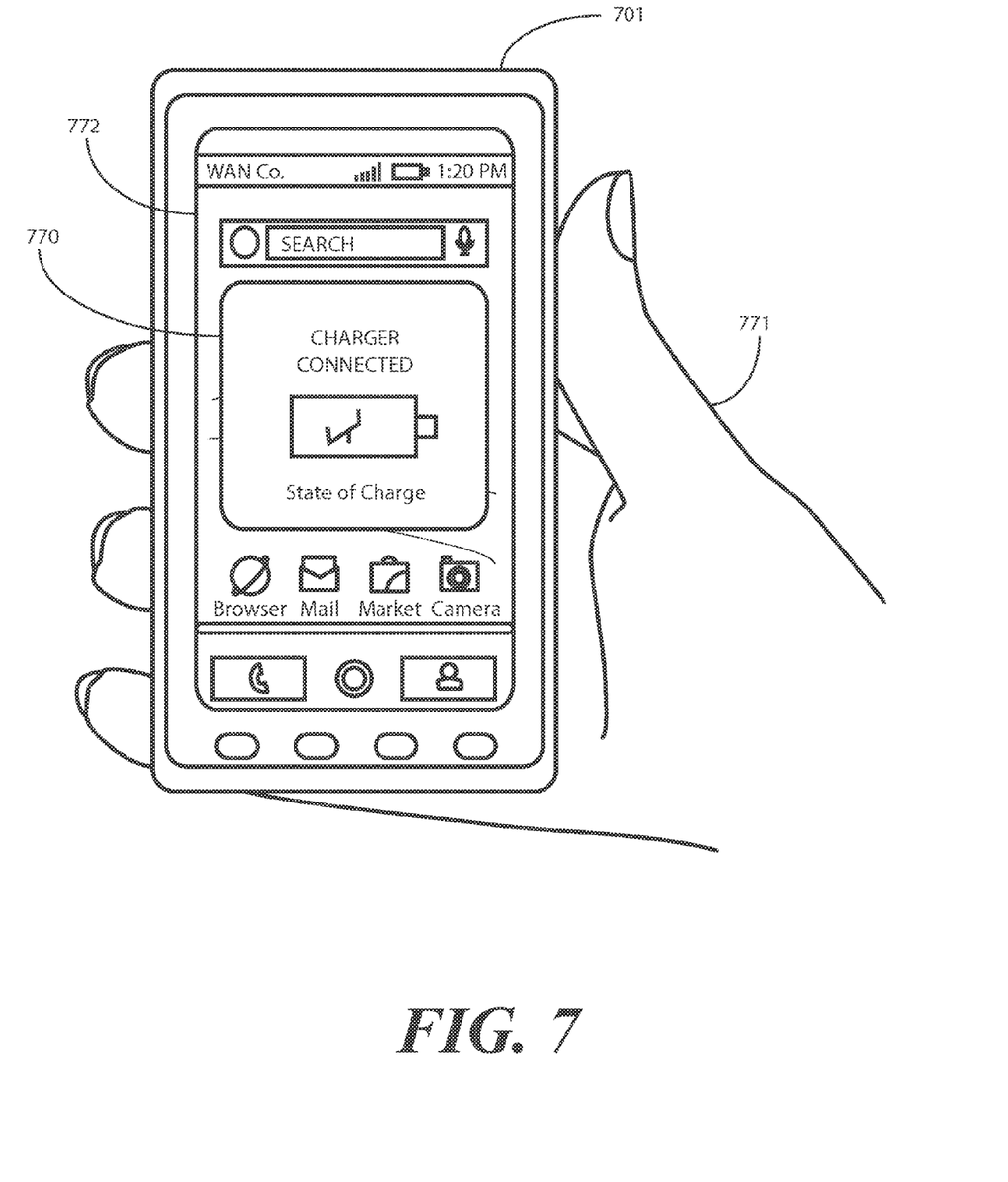
FIG. 7 illustrates an explanatory electronic device comprising a system for estimating cell capacity configured in accordance with one or more embodiments of the disclosure.

At optional step 508, the method 500 can present a state of charge and/or charging status to a user on a user interface. As noted above, in one or more embodiments, the cell energy storage estimation performed by method 500 occurs in the background and is not detectable to a user. Accordingly, the case can occur where a user connects the power supply and/or charger and expects to see an indication of charging presented on a user interface to let the user know that the power supply and/or charger has been properly connected. This presentation can occur at step 508. Turning briefly to FIG. 7, illustrated therein is a device 701 performing step 508. As shown, an indication 770 of the state of charge and/or charging status is presented to a user 771 on a user interface 772.

Turning now back to FIG. 5, at step 509, the method 500 can open a circuit coupled serially between the cell of the battery and a charging terminal. In one embodiment, step 509 occurs in response to detecting a charger coupled to the charging terminal at step 501. In one embodiment, step 509 occurs prior to the charger charging the cell. In one embodiment, step 509 further comprises the connected charger or power supply powering an electronic device coupled to the battery and/or cell while the opening occurs as previously described.

At step 510, the method 500 measures an initial state of the cell by reading a measurement from a fuel gauge. Where the fuel gauge is a Coulomb counter, the method 500 can store a reading of the Coulomb counter at step 510.

As noted above, in one or more embodiments, the opening occurring at step 509 occurs for at least a predetermined duration. Whether the predetermined duration has lapsed is determined at decision 511. In one embodiment, the predetermined duration is about four minutes. In one embodiment, the predetermined duration is at least two minutes. In one embodiment, the predetermined duration is along enough to allow the cell electrochemistry to relax sufficiently such that the method 500 can make the cell capacity estimation with an accuracy within a predefined range, such as about plus or minus five percent.

Where the method 500 is configured as logic instructions (330) having the functionality of legacy systems, an open circuit condition and alert can occur. Specifically, some legacy systems take periodic open circuit voltage measurements during operation. Decision 512 determines is a legacy hardware open circuit voltage measurement is occurring. If it is, the method 500 simply stores that reading at step 513 and is recorded in memory. Illustrating by example, in some legacy circuits an open circuit voltage measurement is taken 130 or so seconds after battery current falls below a threshold such as 50 milliamps. When the open circuit voltage measurement is taken, the corresponding current must be below a threshold, such as 8 milliamps. If it is not, the legacy function may retry to take the open circuit voltage measurement. Where the hardware happens not to be performing one of these open circuit voltage measurements, in one embodiment the method 500 forces the open circuit condition at step 514, measures the open circuit voltage of the cell, and records this value in memory.

In one or more embodiments, the method 500 can confirm the opening of step 509 did occur as a precautionary measure. As mentioned above, the confirmation can comprise one of a measuring instantaneous current to the one or more cells or measuring an average current to the one or more cells. Beginning at decision 515, the method 500 can check to see whether instantaneous current flowing to or from the cell is greater than or equal to a current threshold. Illustrating by example, if the power supply and/or charger has insufficient capacity to power the electronic device to which it is connected, a discharge current from the cell (flowing through parasitic diodes while the pass element is opened from step 509) may exceed the threshold. Where this occurs, the method 500 may terminate at end step 505.

Where the instantaneous current is below the threshold, at step 516, the method 500 again measures a state of the cell. In one embodiment, this is done by again reading a measurement from a fuel gauge. Where the fuel gauge is a Coulomb counter, the method 500 can store a reading of the Coulomb counter at step 516.

At step 517, after the measuring occurring at either step 513 or step 514, the method 500 closes the circuit coupled serially between the cell and the charger to permit charging of the cell by the charger. While this occurs, at optional step 518, the method 500 can present an indication of charge and/or charging status to a user (771) on a user interface (772).

At decision 519, the method 500 can optionally check to see whether an average current flowing to or from the cell is greater than or equal to a current threshold. Illustrating by example, in one embodiment the method can subtract the state of the cell read at step 510 and subtract the state of the cell read at step 516 and can compare this difference to a threshold. Where the difference is above the threshold, this can again indicate discharge current from the cell. Accordingly, the method 500 can terminate at end step 505. Where the difference is less than a threshold, this can serve as confirmation that the opening occurring at step 509 was successful. The method 500 can then advance to step 520.

At step 520, the method 500 can determine the initial state of charge from the open circuit voltage measured at either step 513 or step 514. In one embodiment, step 520 occurs by referencing a look-up table stored in a memory operable with the control circuit. At step 521, the initial state of charge can be stored in memory.

In one or more embodiments, the method 500 can preclude the estimating of cell capacity upon detecting interruption of the charger connection. This can be advantageous where it is desirable not to terminate background operations, applications, or features from running on a connected device. Accordingly, at decision 522, the method 500 can detect whether the charger and/or power supply is removed. Where it is, the method 500 can terminate at end step 505. Otherwise, the method 500 can proceed to decision 523.

At decision 523, the method can detect that charging is nearing completion. This can be done in one embodiment by detecting a charging current has fallen below a predetermined threshold such as 25, 50, 100, or 200 milliamps. Where it has not, decision 522 can be repeated. Where charging is nearing completion, at step 524, the method 500 can again measure a state of the cell. In one embodiment, this is done by again reading a measurement from a fuel gauge. Where the fuel gauge is a Coulomb counter, the method 500 can store a reading of the Coulomb counter at step 524. The difference between the reading read at step 524 and the reading read at step 516 defines an amount of charging occurring after the closing of step 517 in one embodiment. At step 525 the method 500 can estimate an energy storage capacity of the one or more cells from the amount of the charging and the state of charge. In one embodiment, this comprises dividing the amount of charge by a function of the state of charge. EQ. 1 above provides an example of this.

Figure 6:
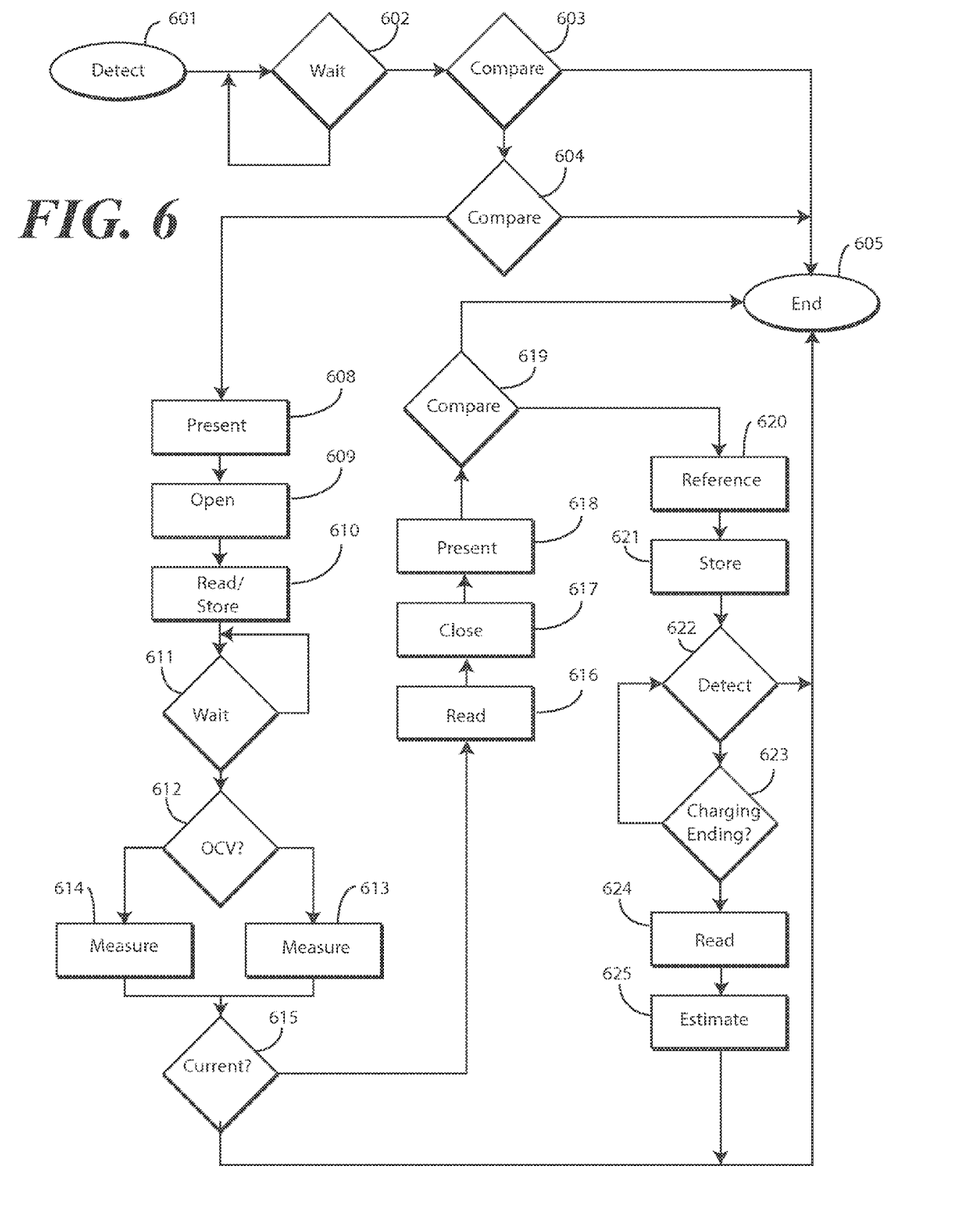
FIG. 6 illustrates another explanatory method for estimating cell capacity configured in accordance with one or more embodiments of the disclosure.

Turning now to FIG. 6, illustrated therein is another explanatory method 600 for estimating cell capacity in accordance with one or more embodiments of the disclosure. The method 600 can be implemented with any of the circuits of FIGS. 1-4.

At starting step 601, the method 600 detects that a charger and/or power supply is connected. In one or more embodiments, the method 600 confirms at least a predetermined duration since a previous estimating has passed at decision 602. For example, in one embodiment, the method 600 checks to see whether a predetermined duration, such as seven days, has passed since the last time the method 600 was run. This optional decision 602 ensures that a predetermined maximum estimation frequency is not exceeded.

In one or more embodiments, the method 600 comprises detecting whether an initial state of charge of one or more cells of a battery coupled between a charger and/or power supply is within a predefined range prior to executing the remainder of the method 600. In the illustrative embodiment of FIG. 6, this occurs at decision 603 and decision 604. At decision 603, the state of charge of the cell is compared to an upper state of charge threshold, which is about sixty percent charged. Where the state of charge is greater than the upper state of charge threshold, the method 600 can terminate at end step 605. At decision 604, the state of charge of the cell is compared to a lower state of charge threshold, which in this embodiment is about twenty percent charged. Where the state of charge is less than the lower state of charge threshold, the method 600 can terminate at end step 605.

At optional step 608, the method 600 can present a state of charge and/or charging status to a user on a user interface. This is shown generally in FIG. 7. At step 609, the method 600 can open a circuit coupled serially between the cell of the battery and a charging terminal. In one embodiment, step 609 occurs in response to detecting a charger coupled to the charging terminal at step 601. In one embodiment, step 609 occurs prior to the charger charging the cell. In one embodiment, step 609 further comprises a charger or power supply powering an electronic device coupled to the battery and/or cell while the opening occurs as previously described.

At step 610, the method 600 measures an initial state of the cell by reading a measurement from a fuel gauge. Where the fuel gauge is a Coulomb counter, the method 600 can store a reading of the Coulomb counter at step 610.

As noted above, in one or more embodiments, the opening occurring at step 609 occurs for at least a predetermined duration. Whether the predetermined duration has lapsed is determined at decision 611. Decision 611 of this illustrative embodiment checks to see whether about four minutes has passed.

Where the method 500 is configured as logic instructions (330) in a safety circuit, an open circuit condition can occur as a result of the safety circuit's operation described above with reference to FIG. 3. Whether the safety circuit components cause an open circuit condition is determined at decision 612. Where it has, the open circuit voltage of the cell is measured at step 613 and is recorded in memory. Where it has not, the method 500 forces the open circuit condition at step 614, measures the open circuit voltage of the cell, and records this value in memory.

In one or more embodiments, the method 600 can confirm the opening of step 609 did occur as a precautionary measure. As mentioned above, the confirmation can comprise one of a measuring instantaneous current to the one or more cells or measuring an average current to the one or more cells. Beginning at decision 615, the method 600 can check to see whether instantaneous current flowing to or from the cell is greater than or equal to a current threshold, which in this embodiment is about ten milliamps.

Where the instantaneous current is below the threshold, at step 616, the method 600 again measures a state of the cell. In one embodiment, this is done by again reading a measurement from a fuel gauge. Where the fuel gauge is a Coulomb counter, the method 600 can store a reading of the Coulomb counter at step 616.

At step 617, after the measuring occurring at either step 613 or step 614, the method 600 closes the circuit coupled serially between the cell and the charger to permit charging of the cell by the charger. While this occurs, at optional step 618, the method 600 can present an indication of charge and/or charging status to a user (771) on a user interface (772).

At decision 619, the method 600 can optionally check to see whether an average current flowing to or from the cell is greater than or equal to a current threshold. Illustrating by example, in one embodiment the method can subtract the state of the cell read at step 610 and an subtract the state of the cell read at step 616 and can compare this difference to a threshold, which in this illustrative embodiment is 660 micro-Ampere-hours. Where the difference is above the threshold, the method 600 can terminate at end step 605. Where the difference is less than a threshold, the method 600 can then advance to step 620.

At step 620, the method 600 can determine the initial state of charge from the open circuit voltage measured at either step 613 or step 614. In one embodiment, step 620 occurs by referencing a look-up table stored in a memory operable with the control circuit. At step 621, the initial state of charge can be stored in memory.

In one or more embodiments, the method 600 can preclude the estimating of cell capacity upon detecting interruption of the charger connection. This can be advantageous where it is desirable not to terminate background operations, applications, or features from running on a connected device. Accordingly, at decision 622, the method 600 can detect whether the charger and/or power supply is removed. Where it is, the method 600 can terminate at end step 605. Otherwise, the method 600 can proceed to decision 623.

At decision 623, the method can detect that charging is nearing completion. This can be done in one embodiment by detecting a charging current has fallen below a predetermined threshold such as 25, 50, 100, or 200 milliamps. Where it has not, decision 622 can be repeated. Where charging is nearing completion, at step 624, the method 600 can again measure a state of the cell. In one embodiment, this is done by again reading a measurement from a fuel gauge. Where the fuel gauge is a Coulomb counter, the method 600 can store a reading of the Coulomb counter at step 624. The difference between the reading read at step 624 and the reading read at step 616 defines an amount of charging occurring after the closing of step 617 in one embodiment. At step 625 the method 600 can estimate an energy storage capacity of the one or more cells from the amount of the charging and the state of charge. In one embodiment, this comprises dividing the amount of charge by a function of the state of charge. EQ. 1 above provides an example of this.

Figure 8:
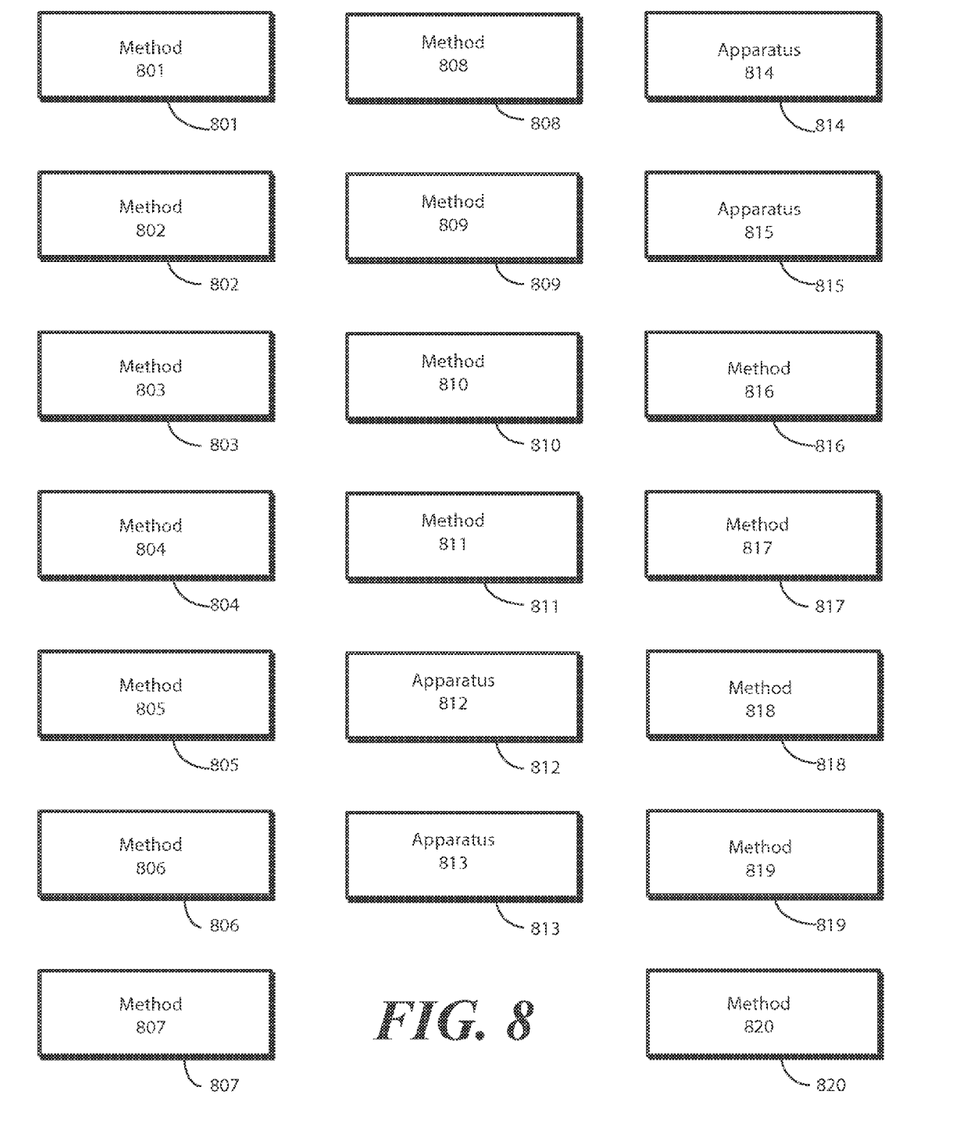
FIG. 8 illustrates various embodiments of the disclosure.

Turning now to FIG. 8, illustrated therein are various embodiments of the disclosure. At 801 a method of estimating cell capacity comprises opening a circuit coupled serially between one or more cells of a battery and a charging terminal in response to detecting a charger coupled to the charging terminal. In one embodiment, at 801 the method opening is prior to the charger charging the one or more cells. At 801, the method measures, with a control circuit in one embodiment, an open circuit voltage of the one or more cells to determine a state of charge of the one or more cells. At 801, after the measuring, the method comprises closing the circuit to permit charging of the one or more cells by the charger. At 801, the method comprises determining an amount of the charging occurring after the closing. At 801, the method comprises estimating an energy storage capacity of the one or more cells from the amount of the charging and the state of charge.

At 802, the method of 801 further comprises detecting whether an initial state of charge prior to the opening is within a predefined range. At 803, the predefined range of 802 is between about twenty percent and about sixty percent.

At 804, the opening of 801 occurs for at least a predetermined duration. At 805, the predetermined duration of 804 is at least two minutes. At 806, the method of 801 further comprises detecting, with a control circuit in one embodiment, the charging nearing completion. At 807, the detecting of 806 comprises detecting a charging current less than a predetermined threshold.

At 808, the measuring of 801 occurs only once between the opening and the estimating. At 809, the method of 801 further comprises confirming the opening prior to the determining. At 810, the confirming of 809 is one of a measuring instantaneous current to the one or more cells or measuring an average current to the one or more cells. At 811, the method of 801 further comprises powering an electronic device coupled to the battery while the opening occurs.

At 812, an apparatus comprises at least one electrochemical cell. At 812, the apparatus comprises at least one pass element serially coupled with the at least one electrochemical cell. At 812, the apparatus comprises a control circuit, operable with the at least one pass element to open the at least one pass element when a charger is connected to the at least one electrochemical cell for at least a predetermined time prior to charging. At 812, the control circuit is operable to measure an open circuit voltage of the at least one electrochemical cell after the predetermined time. At 812, the control circuit is operable to close the at least one pass element to charge the at least one electrochemical cell. At 812, the control circuit is operable to determine an amount of the charge. At 812, the control circuit is operable to store an estimated energy capacity of the at least one electrochemical cell based upon the open circuit voltage and the amount.

At 813, the pass element of 812 comprises a transistor. At 814, the control circuit of 812 is further to confirm the at least one electrochemical cell is within a predefined state of charge range before opening the at least one pass element. At 815, the control circuit of 812 is further to estimate a state of charge of the at least one electrochemical cell by referencing a look-up table stored in a memory operable with the control circuit.

At 816, a method of estimating cell capacity comprises determining a charger connection to one or more electrochemical cells. At 816, the method comprises opening, with a control circuit in one embodiment, a circuit device disposed serially with the one or more electrochemical cells to preclude charging for a predetermined cell relaxation period. At 816, the method comprises, after the predetermined cell relaxation period, identifying a state of charge of the one or more electrochemical cells. At 816, the method comprises closing, with the control circuit in one embodiment, the circuit device to charge the one or more electrochemical cells. At 816, the method comprises receiving, from a measurement circuit such as a fuel gauge in one embodiment, an amount of charge occurring after the closing. At 816, the method comprises estimating the cell capacity from the state of charge and the amount of charge.

At 817, the predetermined cell relaxation period of 816 is sufficient for the estimating to be accurate within a predefined tolerance amount. At 818, the estimating of 816 comprises dividing the amount of charge by a function of the state of charge.

At 819, the method of 816 further comprises confirming at least a predetermined duration since a previous estimating has passed prior to the opening. At 820, the method of 816 further comprises precluding the estimating upon detecting interruption of the charger connection.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited.

Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A method of estimating cell capacity, comprising:
   detecting a charger coupled to a charging terminal of a battery;
   in response to detecting the charger coupled to the charging terminal, and prior to opening a circuit coupled serially between the one or more cells of the battery and the charging terminal, determining an initial state of charge of the one or more cells;
   determining that the initial state of charge is within a predefined range;
   in response to determining that the initial state of charge prior to the opening is within a predefined range:
      opening the circuit coupled serially between the one or more cells of the battery and the charging terminal prior to the charger charging the one or more cells;
      measuring, with a control circuit, an open circuit voltage of the one or more cells to determine a state of charge of the one or more cells;
      after the measuring, closing the circuit to permit charging of the one or more cells by the charger;
      determining an amount of the charging occurring after the closing; and
      estimating an energy storage capacity of the one or more cells from the amount of the charging and the state of charge.

2. The method of claim 1, the predefined range between about twenty percent and about sixty percent.

3. The method of claim 1, the opening occurring for at least a predetermined duration.

4. The method of claim 3, the predetermined duration at least two minutes.

5. The method of claim 1, further comprising detecting, with the control circuit, the charging nearing completion.

6. The method of claim 5, the detecting comprising detecting a charging current less than a predetermined threshold.

7. The method of claim 1, the measuring only occurring once between the opening and the estimating.

8. The method of claim 1, further comprising confirming the opening prior to the determining.

9. The method of claim 8, the confirming one of a measuring instantaneous current to the one or more cells or measuring an average current to the one or more cells.

10. The method of claim 1, further comprising powering an electronic device coupled to the battery while the opening occurs.

11. An apparatus, comprising:
    at least one electrochemical cell;
    at least one pass element serially coupled with the at least one electrochemical cell; and
    a control circuit, operable with the at least one pass element to:
       detect that a charger is coupled to the at least one electrochemical cell;
       in response to detecting the charger coupled to the at least one electrochemical cell and prior to opening the at least one pass element, determine that an initial state of charge of the at least one electrochemical cell is within a predefined state of charge range;
       in response to determining that the initial state of charge prior to the opening is within the predefined charge range;
       open the at least one pass element prior to charging;
       measure an open circuit voltage of the at least one electrochemical cell;
       close the at least one pass element to charge the at least one electrochemical cell;
       determine an amount of the charge; and
       store an estimated energy capacity of the at least one electrochemical cell based upon the open circuit voltage and the amount of the charge.

12. The apparatus of claim 11, wherein the at least one pass element comprises a transistor.

13. The apparatus of claim 11, wherein the control circuit is further operable to estimate a state of charge of the at least one electrochemical cell by referencing a look-up table stored in a memory operable with the control circuit.

* * * * *